US011106555B2

(12) United States Patent
Okada

(10) Patent No.: US 11,106,555 B2
(45) Date of Patent: Aug. 31, 2021

(54) SEMICONDUCTOR MEMORY DEVICE WITH REDUNDANT MEMORY AREA

(71) Applicant: LAPIS Semiconductor Co., Ltd., Yokohama (JP)

(72) Inventor: Toshiharu Okada, Yokohama (JP)

(73) Assignee: LAPIS SEMICONDUCTOR CO., LTD., Yokohama (JP)

( * ) Notice: Subject to any disclaimer, the term of this patent is extended or adjusted under 35 U.S.C. 154(b) by 64 days.

(21) Appl. No.: 16/515,741

(22) Filed: Jul. 18, 2019

(65) Prior Publication Data
US 2020/0026628 A1 Jan. 23, 2020

(30) Foreign Application Priority Data
Jul. 20, 2018 (JP) .............................. JP2018-136810

(51) Int. Cl.
*G06F 11/00* (2006.01)
*G06F 11/20* (2006.01)

(52) U.S. Cl.
CPC ...... *G06F 11/2094* (2013.01); *G06F 2201/82* (2013.01); *G06F 2201/85* (2013.01)

(58) Field of Classification Search
CPC ............. G06F 11/2094; G06F 11/1016; G06F 11/108; G06F 11/1048; G06F 11/1056
See application file for complete search history.

(56) References Cited

U.S. PATENT DOCUMENTS

| 6,373,758 B1* | 4/2002 | Hughes | G11C 29/44 365/200 |
| 8,397,132 B2* | 3/2013 | Fukuyama | G06F 11/1048 714/763 |
| 8,547,751 B2* | 10/2013 | Tanikawa | G11C 16/24 365/185.21 |
| 8,693,271 B2* | 4/2014 | Raval | G11C 29/06 365/201 |
| 9,047,252 B1* | 6/2015 | Lee | G11C 29/00 |
| 9,070,482 B2* | 6/2015 | Miyazaki | G11C 29/76 |
| 9,075,741 B2* | 7/2015 | Koker | G06F 11/1048 |
| 9,953,725 B2* | 4/2018 | Ryu | G06F 11/1068 |
| 10,108,509 B2* | 10/2018 | Qidwai | G06F 11/1048 |
| 10,115,479 B2* | 10/2018 | Kim | G11C 29/76 |
| 10,684,793 B2* | 6/2020 | Chung | G06F 3/0679 |

(Continued)

FOREIGN PATENT DOCUMENTS

JP 2008-108390 A 5/2008

*Primary Examiner* — Elmira Mehrmanesh
(74) *Attorney, Agent, or Firm* — Rabin & Berdo, P.C.

(57) ABSTRACT

A semiconductor memory device has a memory cell array area including a normal area including memory blocks and a redundant memory area including a redundant block which is a replacement target of a defective block among memory blocks; a storage unit storing address information indicating a position of the defective block in the normal area and address information indicating a position of the redundant block being the replacement target of the defective block, both being in association with each other as a first information; and an output circuit outputting a data row exhibiting a positional relation between the defective block and a memory block other than the defective block in the normal area based on the first information stored in the storage unit in response to the data read signal.

5 Claims, 7 Drawing Sheets

(56) References Cited

U.S. PATENT DOCUMENTS

| | | | | |
|---|---|---|---|---|
| 10,698,841 B2* | 6/2020 | Nagashima | ......... | G06F 11/1004 |
| 2002/0093032 A1* | 7/2002 | Hanzawa | ............. | G11C 29/787 |
| | | | | 257/200 |
| 2009/0196108 A1* | 8/2009 | Kambara | ............... | G11C 29/24 |
| | | | | 365/189.05 |
| 2011/0099459 A1* | 4/2011 | Nakamura | ........... | G11C 7/1006 |
| | | | | 714/763 |
| 2015/0287476 A1* | 10/2015 | Park | ..................... | G11C 29/028 |
| | | | | 714/723 |
| 2018/0286496 A1* | 10/2018 | Kamano | .......... | G11C 29/50012 |

* cited by examiner

SEMICONDUCTOR MEMORY DEVICE WITH REDUNDANT MEMORY AREA

CROSS-REFERENCE TO RELATED APPLICATION

This application is based upon and claims the benefit of priority from the prior Japanese Patent Application No. 2018-136810 filed on Jul. 20, 2018, the entire contents of which are incorporated herein by reference.

BACKGROUND

1. Technical Field

The present invention relates to a semiconductor memory device.

2. Description of the Related Art

In a process of manufacturing the semiconductor memory device such as a dynamic random access memory (DRAM), a test of determining the quality of the semiconductor memory device is performed in the wafer test process of the wafer on which the semiconductor memory device is formed. In such a test, a memory cell that does not satisfy a predetermined operating condition is detected as a fail cell. In the semiconductor memory device, the redundant memory area is provided in addition to the normal memory area, and a memory cell determined to be the fail cell in the test is replaced with a cell in the redundant memory area (redundant cell). That is, when access is attempted to the address of the fail cell, access is performed to the address of the redundant cell instead of the fail cell. If there are detected the fail cells greater than the number of redundant cells, the semiconductor memory device is determined to be defective.

Further a parallel test of expected-value comparing-type has been proposed heretofore in order to improve the rate of fail-bit detection and the testability in a semiconductor memory device. In the parallel test of expected-value comparing-type, data read from a memory cell is compared with an expected-value data. The target of the test is an ordinary memory array that is not a redundant cell. Thus, there is a problem that the expected value is unknown in a case where the access is performed to the redundant cell. Thus a test method of semiconductor memory device is proposed (in JP 2008-108390 A, for example) in which the test of a normal area and the test of a redundant area are performed separately. In that test method, an output of a logic circuit from the redundant area is masked when the normal area is tested, and an output of a logic circuit from the normal area is masked when the redundant area is tested, whereby the parallel test of expected-value comparing-type is achieved even after replacement with redundant cells.

SUMMARY

However, when the test is performed according to the above-mentioned prior art method, it is necessary to obtain information indicating which memory cell has been replaced by the redundant cell. In order to acquire the information, it is necessary to write data in the normal memory area and the redundant memory area as preparation. Since the process of issuing a command of a write operation corresponding to the writing of each memory cell by the DRAM controller or the like from the outside of the DRAM is repeated for all of the memory cells, there is a problem that it takes certain time for writing.

The present invention has been made in view of the above problems, and its purpose is to provide a semiconductor memory device capable of outputting the data row indicating the arrangement relationship between the normal block and the defective block of memory cells in a short time.

According to an aspect of the present invention, there is provided a semiconductor memory device comprising:
a memory cell array unit including
a normal memory area including a plurality of memory blocks each including a plurality of memory cells and
a redundant memory area including a redundant block which is a replacement target of a defective block among a plurality of memory blocks as an access to another address, and includes a redundant block having the another address;
a storage unit that stores address information indicating a position of the defective block in the normal memory area and address information indicating a position of the redundant block which is the replacement target of the defective block, both the address information being in association with each other as a first information; and
an output circuit that outputs a data row having binary data exhibiting, for at least a partial area of the normal memory area, a positional relation between the defective block and a memory block other than the defective block in the normal memory area based on the first information stored in the storage unit in response to a data read signal.

According to another aspect of the present invention, there is provided a semiconductor memory device comprising:
a memory cell array unit including
a normal memory area including a plurality of memory blocks each including a plurality of memory cells and
a redundant memory area including a redundant block which is a replacement target of a defective block among a plurality of memory blocks as an access to another address, and includes a redundant block having the another address;
a storage unit that stores address information indicating a position of the defective block in the normal memory area and address information indicating a position of the redundant block which is the replacement target of the defective block, both the address information being in association with each other as a first information; and
a fixed-value writing circuit, based on the first information stored in the storage unit in response to a data write start signal, writes data of one value of binary data to the redundant block corresponding to the defective block, and writes the data of the other value to a memory block other than the defective block in the normal memory area.

According to the semiconductor memory device of the present invention, it is possible that the semiconductor memory device outputs the data row indicating the arrangement relationship between the normal block and the defective block of the memory cell in a short time.

DETAILED DESCRIPTION

Figure 1:
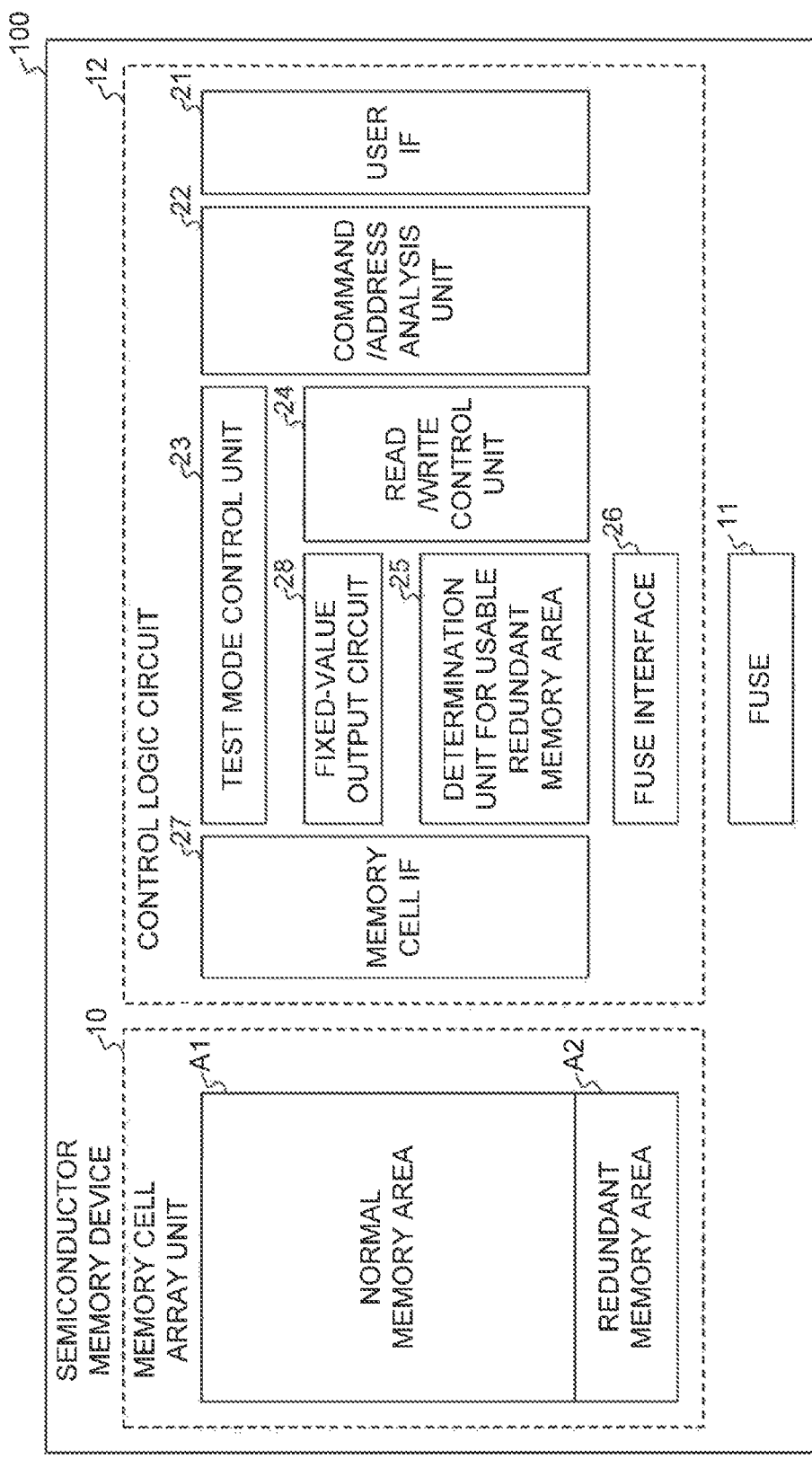
FIG. 1 is a block diagram showing the configuration of a semiconductor memory device of a first embodiment.

The preferred embodiments of the present invention will be described in detail below. In the description of the following embodiments and the accompanying drawings, substantially the same or equivalent parts are denoted by the same reference numerals.

First Embodiment

FIG. 1 is a block diagram showing the configuration of a semiconductor memory device 100 of the present embodiment. The semiconductor memory device 100 is configured of a dynamic random access memory (DRAM), for example. The semiconductor memory device 100 includes a memory cell array unit 10, a fuse 11, and a control logic circuit 12.

The memory cell array unit 10 is configured of a normal memory area A1 and a redundant memory area A2. The normal memory area A1 is a memory area composed of memory cells to be subjected to normal memory access. The redundant memory area A2 is a memory area including redundant blocks. The redundant block is a replacement target which is a block including a predetermined number or more of defective cells (hereinafter, referred to as a defective block) in the normal memory area A1.

The fuse 11 has a function of a storage unit that stores addresses of the defective blocks as "redundant addresses" in association with the destination addresses of the redundant blocks to be replaced. The fuse 11 is composed of a plurality of fuse elements, and stores information of the redundant addresses by cutting the fuse elements.

Figure 2A:
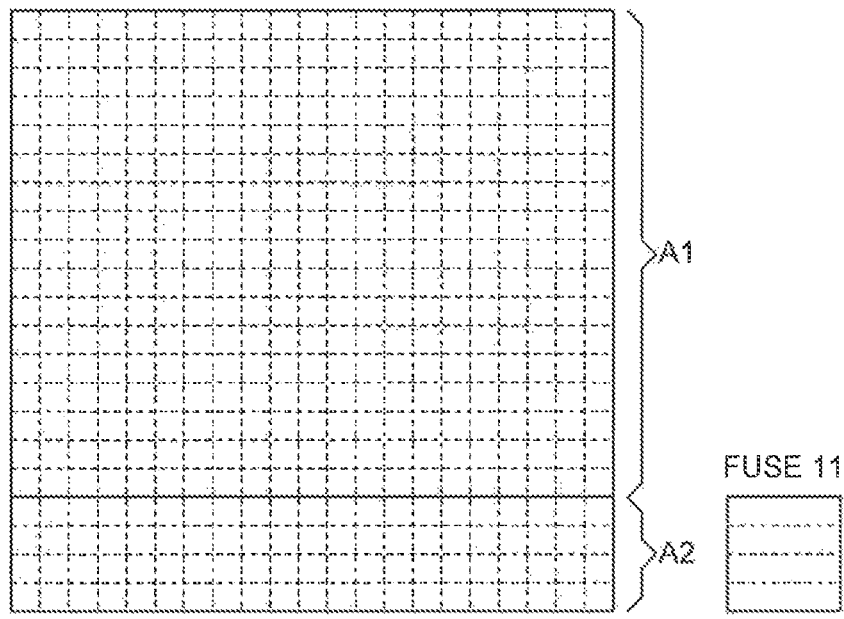
FIG. 2A is a diagram schematically showing the configuration of a memory cell array unit.

FIG. 2A is a diagram schematically showing the configuration of the memory cell array unit 10 and the fuse 11. Each of the normal memory area A1 and the redundant memory area A2 in the memory cell array unit 10 is composed of a plurality of cells. In the present embodiment, the cells in the normal memory area A1 are assigned an address for each row. In the semiconductor memory device 100 of the present embodiment, the normal memory area A1 and the redundant memory area A2 have the same number of columns, and replacement of a normal cell with the redundant cell is performed row by row. That is, in the normal memory area A1, a row including a defective cell is treated as a defective block. In the redundant memory area A2, each row is treated as a redundant block. The fuse 11 has a storage area corresponding to each row of the redundant memory area A2 (i.e., each redundant block).

Figure 2B:
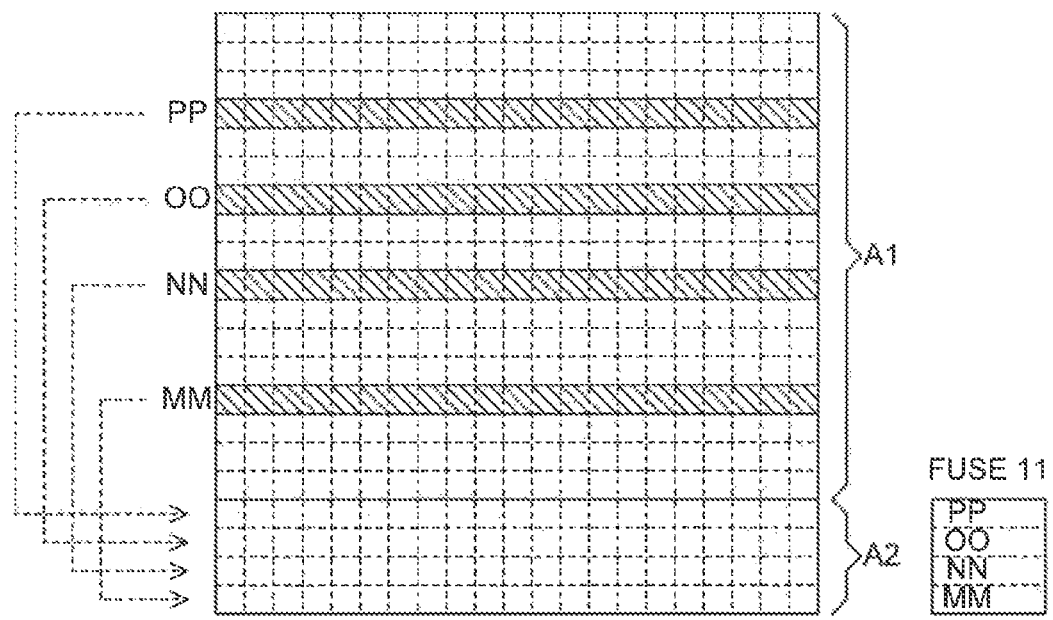
FIG. 2B is a view schematically showing an image when a redundant memory area is used in the semiconductor memory device of the first embodiment.

FIG. 2B is a view schematically showing an image when the redundant memory area is used in the semiconductor memory device of the present embodiment. Here, blocks of addresses PP, OO, NN and MM of the normal memory area A1 are treated as the defective block and are indicated by hatching.

In the fuse 11, the addresses of the defective block, PP, OO, NN and MM are set and stored as the redundant address. As a result, the blocks at the addresses PP, OO, NN and MM of the normal memory area A1 are replaced with the blocks of the first, second, third and fourth lines of the redundant memory area A2, respectively.

Referring back to FIG. 1, the control logic circuit 12 includes a user IF (interface) 21, a command/address analysis unit 22, a test mode control unit 23, a read/write control unit 24, a determination unit for usable redundant memory area 25, a fuse interface 26, a memory cell IF (interface) 27 and a fixed-value output circuit 28.

The user IF 21 is an interface unit that receives a command (command signal) such as writing or reading to the memory cell array unit 10 from the outside of the semiconductor memory device 100.

The command/address analysis unit 22 analyzes what the command indicates (for example, writing or reading) for the command received by the user IF 21. Also, the command/address analysis unit 22 analyzes the address of the memory cell that is the target of the command.

The test mode control unit 23 controls the respective operations of units in the control logic circuit 12 in the test mode. For example, the test mode control unit 23 switches between valid and invalid of a fixed-value output function of outputting the fixed value exhibited by the fixed-value output circuit 28 in response to the command received via the user IF 21.

The read/write control unit 24 controls read and write operations for respective memory cells of the memory cell array unit 10. The read/write control unit 24 controls the read operation or the write operation based on the command analyzed by the command/address analysis unit 22.

The determination unit for usable redundant memory area 25 decides which to access either the normal memory area A1 of the memory cell array unit 10 or the redundant memory area A2 based on the address analyzed by the command/address analysis unit 22.

The fuse interface 26 accesses the fuse 11 to determine the access destination in the memory cell array unit 10 when controlling the read/write control unit 24. Specifically, the fuse interface 26 accesses the fuse 11 to check whether or not the access destination block in the memory cell array unit 10 specified by the user IF 21 is a replacement target block to be replaced with the redundant block.

The memory cell IF 27 is an interface unit that accesses the memory cell array unit 10 according to the control of the read/write control unit 24. The memory cell IF 27 accesses the redundant block when the access destination block is a replacement target block to be replaced with the redundant block. When the access destination block is not the replacement target block, the memory cell IF 27 accesses the access destination block (memory area) specified by the user IF 21.

The fixed-value output circuit 28 is controlled to be valid or invalid according to the control of the test mode control unit 23, and outputs a fixed value when it is valid. Specifically, the fixed-value output circuit 28 outputs a data row consisting of binary data indicating an arrangement relationship between a defective block in the normal memory area A1 and a block other than the defective block (normal block). For example, the fixed-value output circuit 28 outputs the data row of "0" or "1" appearing when data for one column of memory cells is continuously read from the memory cell array unit 10 in a state where "0" are written to the memory cells of the normal block and "1" are written to the memory cells of the redundant block.

Figure 3A:
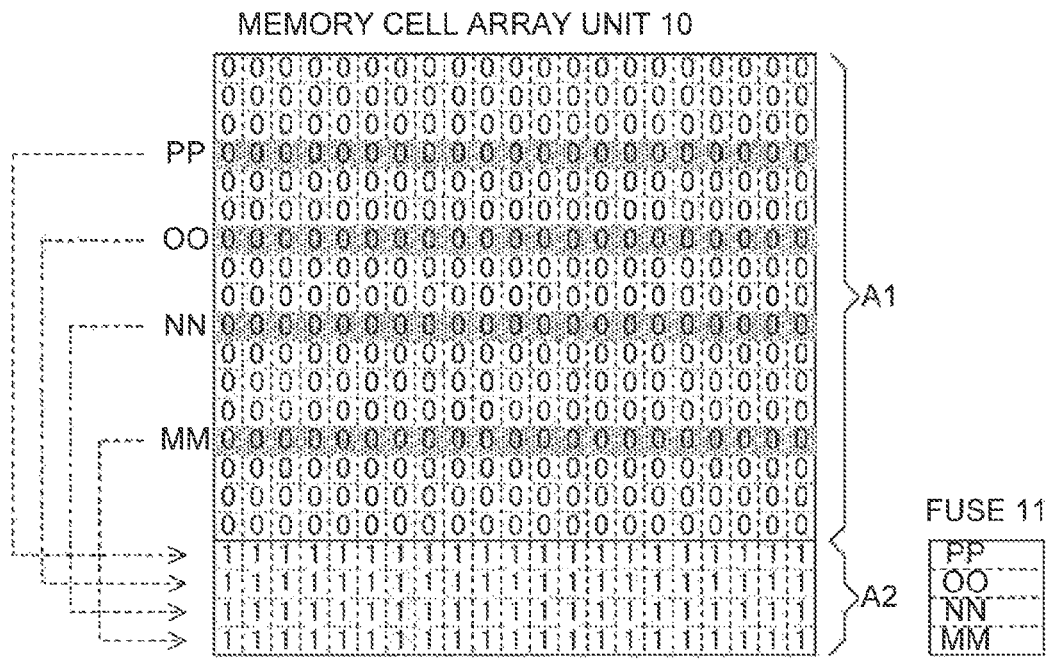
FIG. 3A is a diagram showing the memory cell array unit when "0" are written to the memory cells of a normal block and "1" are written to the memory cells of the redundant block.

FIG. 3A is a diagram showing the memory cell array unit 10 when "0" are written to the memory cells of the normal block and "1" are written to the memory cells of the redundant block. Since the blocks of the addresses PP, OO, NN and MM are replaced with the redundant blocks, data "1" are read instead of data "0" when the memory cells of these blocks are accessed.

Figure 3B:
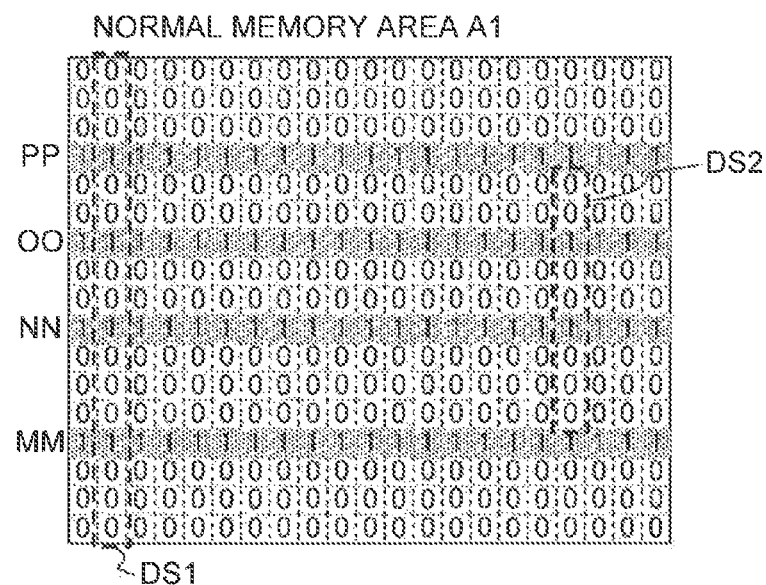
FIG. 3B is a diagram schematically illustrating an image of accessing to the normal block and the redundant block.

FIG. 3B is a diagram illustrating an image of reading data from memory cells. There appears a distribution pattern in which the defective blocks are replaced by the redundant blocks. The read positions and sizes of the data row output by the fixed-value output circuit 28 are predetermined. The information of the data row is supplied to the semiconductor memory device 100, as being a part of information included in a command issued by a DRAM controller (not shown) or the like which is external to the semiconductor memory device 100. For example, when data of one column in the normal memory area A1 is specified, "00010010010001000" is output as shown as DS1 in the figure. Further, when a partial area less than one column is designated, for example, "001001000" is output as shown as DS2 in the figure.

Figure 4:
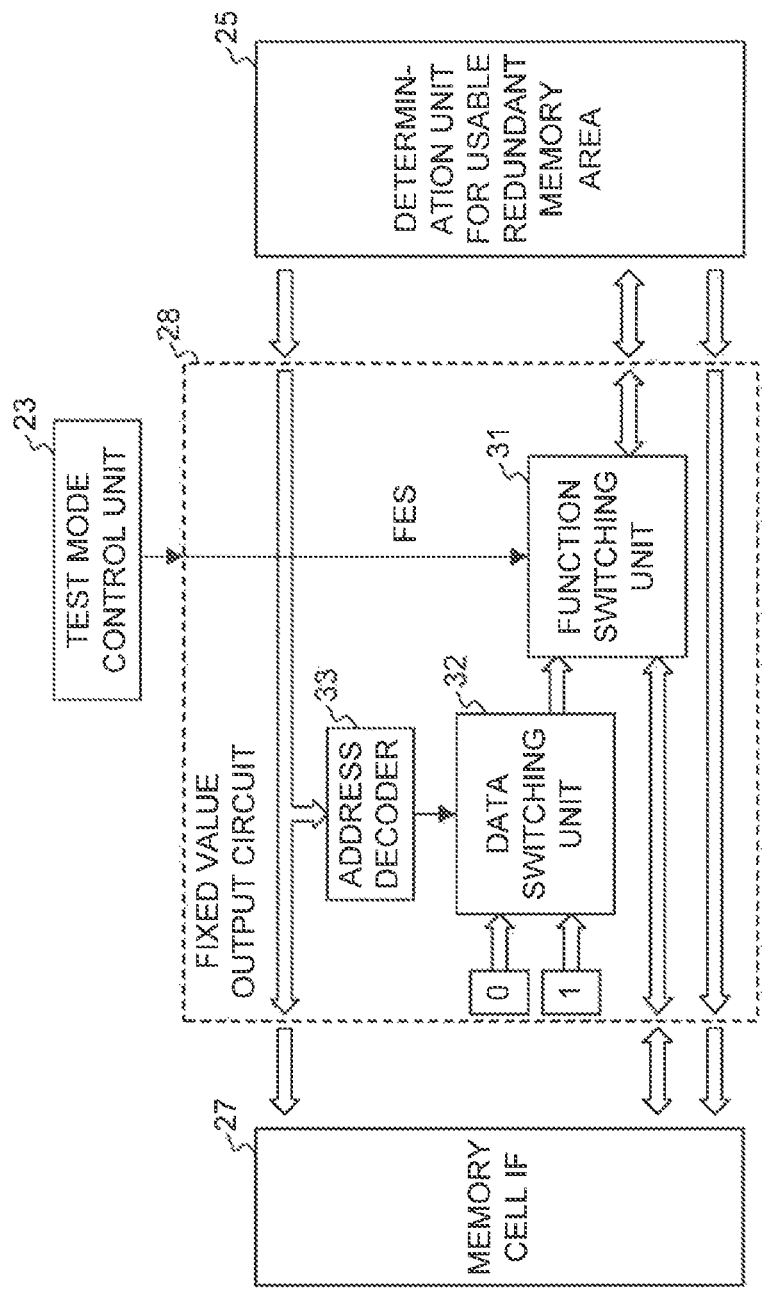
FIG. 4 is a block diagram showing a configuration of the fixed-value output circuit and a data flow therein.

FIG. 4 is a block diagram showing the configuration of the fixed-value output circuit 28 and data input/output. The fixed-value output circuit 28 includes a function switching unit 31, a data switching unit 32, and an address decoder 33.

The function switching unit 31 switches its output function accordance with a function enable signal FES supplied from the test mode control unit 23 so as to output either the output data received from the data switching unit 32 or the data read from the memory cell array unit 10 through the memory cell IF 27. For example, when the function enable signal FES is invalid, the function switching unit 31 outputs the data read from the memory cell array unit 10 via the memory cell IF 27. On the other hand, when the function enable signal FES is enabled, the function switching unit 31 outputs the fixed value which is data on the data switching unit 32 side.

The data switching unit 32 outputs the fixed value "0" or "1" to the function switching unit 31 in response to the switching of the address decoder 33.

The address decoder 33 switches the data switching unit based on the determination result generated by the determination unit for usable redundant memory area 25 (that is, whether the access destination is the normal memory area A1 or the redundant memory area A2). Specifically, the data switching unit 32 is switched so as to output "0" when the access destination is the normal memory area A1, and to output "1" when the access destination is the redundant memory area A2.

Thus, during the fixed-value output function of the fixed-value output circuit 28 being set to be valid, "0" is output at the time of read access to the normal memory area A1, alternatively, "1" is output at the time of read access to the redundant memory area A2. On the other hand, during the fixed-value output function of the fixed-value output circuit 28 being set to be invalid, the memory cell array unit 10 is accessed and the data stored in the memory cell is read. That is, when the fixed-value output circuit 28 is set to the first output mode (that is, the fixed-value output function is enabled), the data row consisting of "0" and "1" is output. When the fixed-value output circuit 28 is set to the second output mode (that is, the fixed-value output function is disabled), the data actually stored in the memory cell array unit 10 is output.

Figure 5:
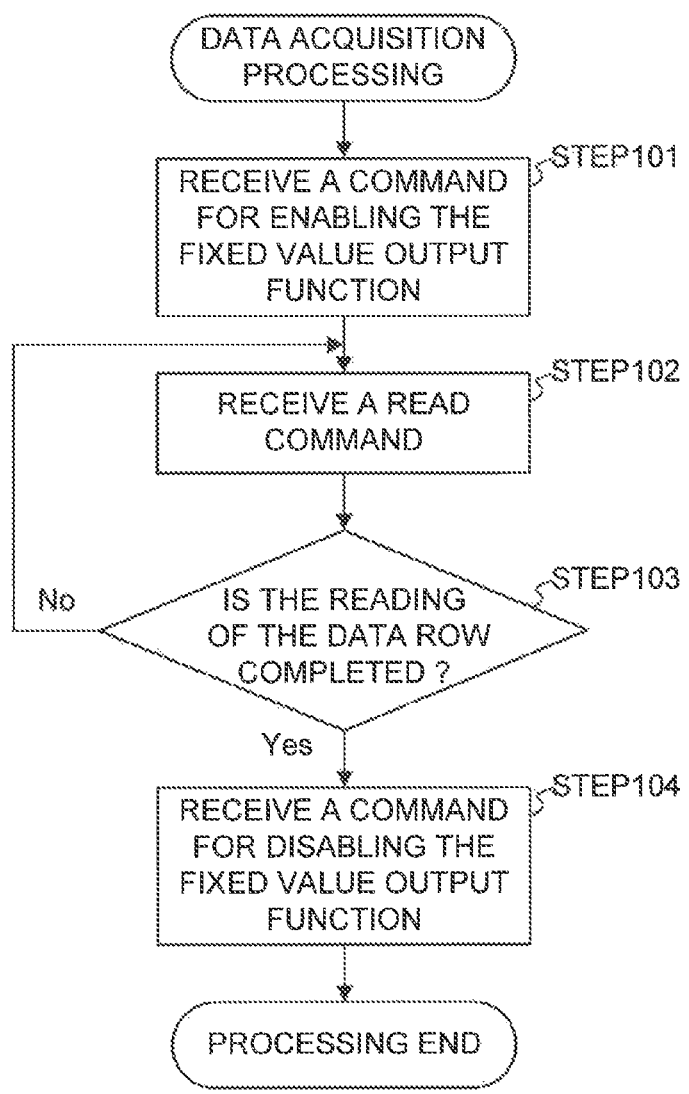
FIG. 5 is a flowchart showing a processing routine of data acquisition processing.

Next, there will be described a processing operation of data acquisition processing performed by the semiconductor memory device 100 of the present embodiment with reference to the flowchart of FIG. 5.

First, a test mode control command including a command for enabling the fixed value output function of the fixed-value output circuit 28 is issued from the outside of the semiconductor memory device 100 (for example, the DRAM controller). The semiconductor memory device 100 receives the test mode control command via the user IF 21 (STEP 101).

The command/address analysis unit 22 analyzes the command and supplies the result to the test mode control unit 23. The test mode control unit 23 switches the function switching unit 31 so that the function switching unit 31 outputs data of the data switching unit 32 side. Thus, the semiconductor memory device 100 in the outputting state always outputs "0" at the time of Read access to the normal memory area A1, and always outputs "1" at the time of Read access to the redundant memory area A2, regardless of the content of data held by the memory cell.

Next, the semiconductor memory device 100 receives a Read command (command to read) via the user IF 21 (STEP 102). The fixed-value output circuit 28 outputs a distribution pattern that appears when "0" is written to the normal memory area A1 of the memory cell array unit 10 and "1" is written to the redundant memory area A2. When specifying the address of a desired output together with the Read command (read out command) via the user IF 21, the fixed-value output circuit 28 outputs the data row extracted, on the basis of the specified address, from the distribution pattern that appears when "0" is written to the normal memory area A of the memory cell array unit 10 and "1" to the redundant memory area A2.

The semiconductor memory device 100 determines whether the reading of the data row is completed (STEP 103). If it is determined that the read is not completed (STEP 103: No), the process returns to STEP 102 to wait for the reception of the Read command again.

When the reading of the data row is completed (STEP 103: Yes), there is issued a command to invalidate the function of the fixed-value output circuit 28 from the outside of the semiconductor memory device 100 (for example, the DRAM controller) in order to return the semiconductor memory device 100 to a normal use state. The semiconductor memory device 100 receives the command via the user IF 21 (STEP 104).

The command/address analysis unit 22 analyzes the command and supplies the result to the test mode control unit 23. The test mode control unit 23 switches the function switching unit 31 so that the function switching unit 31 outputs data of the memory cell IF 27 side. As a result, the semiconductor memory device 100 is in a state of outputting the content of the data held in the memory cells.

As described above, the semiconductor memory device 100 of the present embodiment has the fixed-value output circuit 28 and outputs the data row consisting of binary data indicating the arrangement relationship between the respective normal blocks and the respective defective blocks. According to such a configuration, the data row can be obtained in a short time without actually writing data to the memory area as being similar to the case where "0" is written to the memory cells of the normal memory area A1 and "1" is written to the memory cells of the redundant memory area A2.

Further, since the data row can be output while maintaining the stored data in the memory cell array unit 10 without requiring writing for the data row output, it is possible to obtain the data row without being affected with the usage status of the memory cell array unit 10.

Second Embodiment

Figure 6:
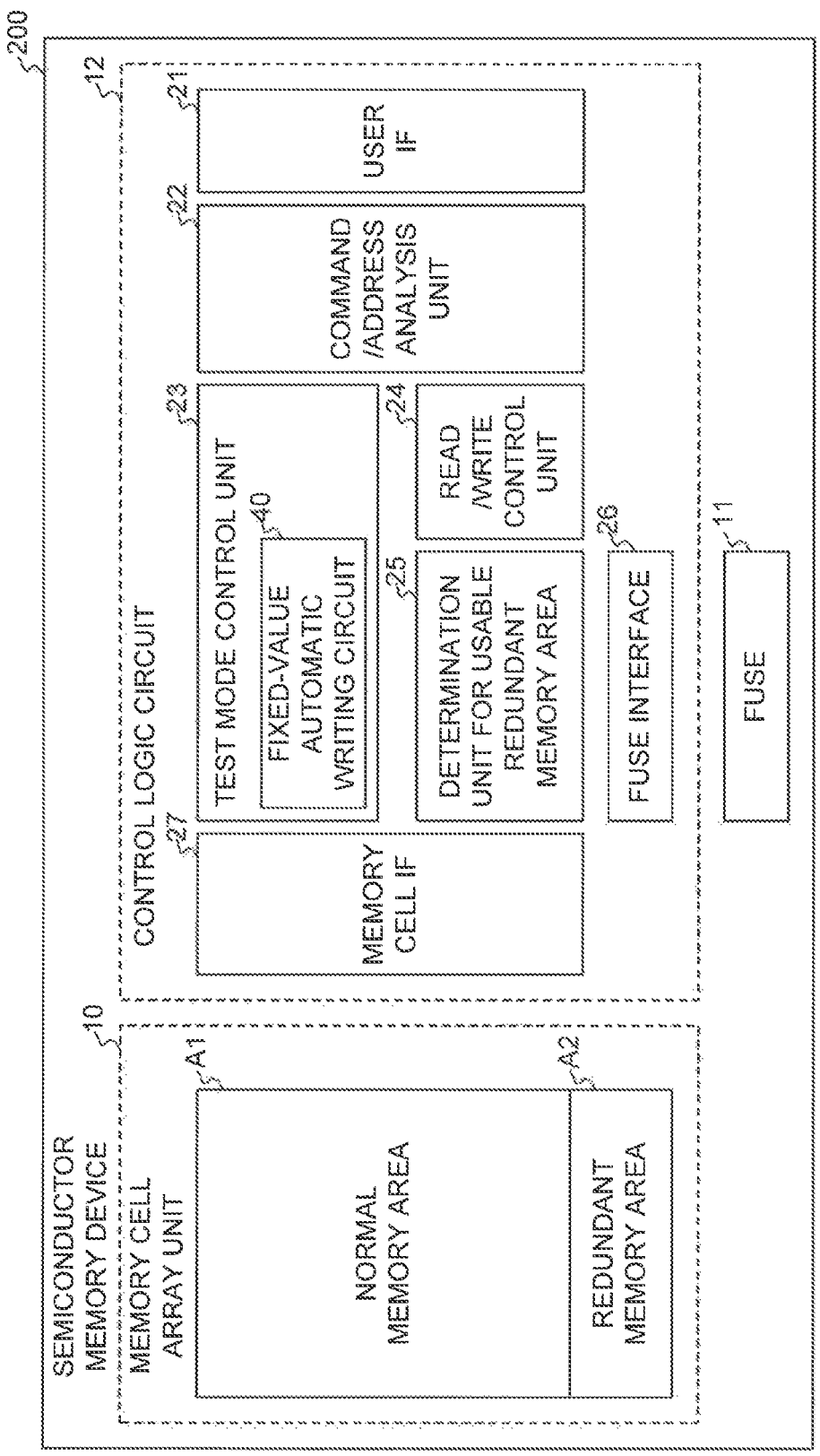
FIG. 6 is a block diagram showing a configuration of the semiconductor memory device of a second embodiment.

Next, a second embodiment of the present invention will be described. FIG. 6 is a block diagram showing the configuration of the semiconductor memory device 200 of the present embodiment. The semiconductor memory device 200 of the present embodiment is different from the semiconductor memory device 100 of the first embodiment in having a fixed-value automatic writing circuit 40 instead of the fixed-value output circuit 28.

The fixed-value automatic writing circuit 40 is provided in the test mode control unit 23. The fixed-value automatic writing circuit 40 has a function of writing "0" on the all of cells of the normal memory area A1 of the memory cell array unit 10 and automatically writing "1" on the all of cells of the redundant memory area A2.

Figure 7:
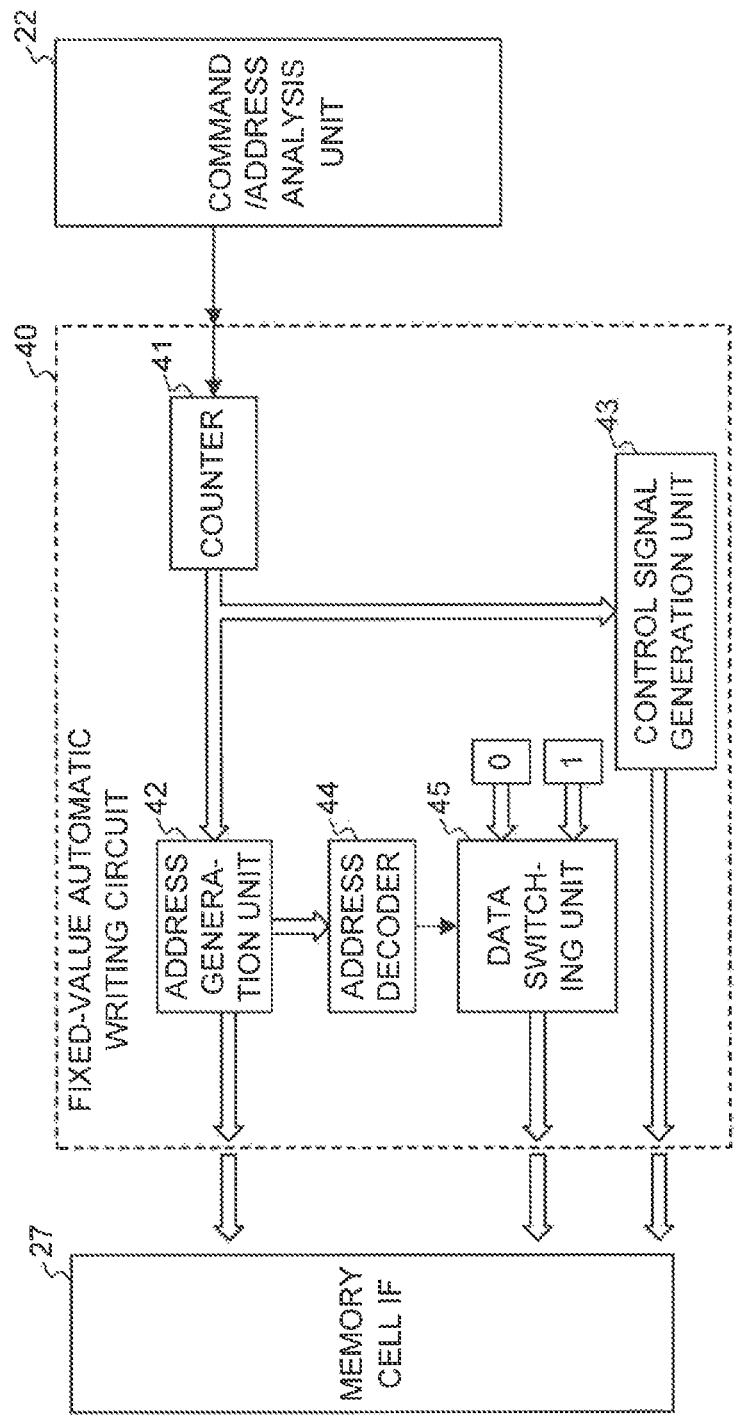
FIG. 7 is a block diagram showing a configuration of a fixed-value automatic writing circuit and a data flow therein.

FIG. 7 is a block diagram showing a configuration of a fixed-value automatic writing circuit 40 and data input to this circuit and output from this circuit. The fixed-value automatic writing circuit 40 includes a counter 41, an address generation unit 42, a control signal generation unit 43, an address decoder 44, and a data switching unit 45.

The counter 41 starts counting in response to a command supplied, via the command/address analysis unit 22, from a DRAM controller or the like which is external to the semiconductor memory device 200. The counter 41 counts up the number of times of writing of the all of areas of the memory cell array unit 10.

The address generation unit 42 generates an address by incrementing the count of the counter 41. In addition, the control signal generation unit 43 generates a control signal.

The address decoder 44 determines whether the address generated by the address generation unit 42 indicates either the normal memory area A1 or the redundant memory area A2 and supplies the result to the data switching unit 45.

The data switching unit 45 determines either "0" as data to be written to the memory cell array unit 10 when the determination result by the address decoder 44 is the normal memory area A1, or, "1" as data to be written to the memory cell array unit 10 when that determination result is the normal memory area A2.

The fixed-value automatic writing circuit 40 performs a writing process in response to the issuance of a command for writing data to the all of cells of the normal memory area and the redundant memory area from a DRAM controller or the like which is external to the semiconductor memory device 200. That is, the semiconductor memory device 200 generates an automatic write start signal in response to the reception of the all of cell write command through the user IF 21 and supplies the automatic write start signal to the test mode control unit 23. The fixed-value automatic writing circuit 40 writes "0" on the all of cells of the normal memory area A1 and "1" on the all of cells of the redundant memory area A2 in response to the automatic write signal.

The semiconductor memory device 200 outputs the data row composed of "0" and "1" data written to the memory cell array unit 10 in response to a Read command received via the user IF 21 from the DRAM controller or the like which is external to the semiconductor memory device 200.

As described above, in the semiconductor memory device 200 of the present embodiment, the fixed-value automatic writing circuit 40 provided inside the test mode control unit 23 performs the writing of "0" to the normal memory area A1 of the memory cell array unit 10 and the writing of "1" to the redundant memory area A2. According to this configuration, writing can be performed in less time in comparison with writing from the outside of the semiconductor memory device 200.

For example, in the case of a 1 Gbit DRAM with a maximum data rate of 1600 Mbps, at least 1024 Mbit/1600 Mbps=640 ms is required for writing the all cells of the normal memory area A1. Furthermore, repeated processing time is required for the DRAM controller to issue 8 million or more commands. On the other hand, according to the semiconductor memory device 200 of the present embodiment, since the issuance of a command from the DRAM controller can be performed only once, the processing time can be greatly reduced.

The present invention is not limited to the above mentioned embodiments. For example, in the second embodiment, there has been described the case of writing operation in that the fixed-value automatic writing circuit 40 writes "0" or "1" to memory area A1 and the redundant memory area A2 in response to a command for writing of all the areas of the normal and redundant memory areas issued by the DRAM controller. However, the timing of writing data is not limited to such a case. For example, regardless of a command from the DRAM controller, it is possible to automatically perform the writing process after reset release.

It is understood that the foregoing description and accompanying drawings set forth the preferred embodiments of the present invention at the present time. Various modifications, additions and alternative designs will, of course, become apparent to those skilled in the art in light of the foregoing teachings without departing from the spirit and scope of the disclosed invention. Thus, it should be appreciated that the present invention is not limited to the disclosed Examples but may be practiced within the full scope of the appended claims.

What is claimed is:

1. A semiconductor memory device with redundant memory area comprising:
   a memory cell array unit including
   a normal memory area including a plurality of memory blocks each including a plurality of memory cells and
   a redundant memory area including a redundant block which is a replacement target of a defective block among a plurality of memory blocks;
   a storage unit that stores defective block address information indicating a position of the defective block in the normal memory area and redundant block address information indicating a position of the redundant block which is the replacement target of the defective block, both the defective block address information and the redundant block address information being in association with each other as first information; and
   an output circuit that outputs a data row having binary data exhibiting, for at least a partial area of the normal memory area, a positional relation between the defective block and a memory block other than the defective block in the normal memory area based on the first information stored in the storage unit in response to a data read signal;

wherein the output circuit generates the data row based on a distribution pattern of the binary data appearing in the memory cell array unit assuming that data of one value of the binary data is written to the redundant block which is the replacement target of the defective block while data of another value of the binary data is written to a memory block other than the defective block in the normal memory area.

2. The semiconductor memory device with redundant memory area according to claim 1, wherein the output circuit receives addressing specifying at least a partial area of the normal memory area together with a data reading signal, and extracts a distribution pattern corresponding to a region specified by the addressing from the distribution pattern of the binary data appearing in the memory cell array unit, and outputs it as the data row.

3. A semiconductor memory device with redundant memory area comprising:
   a memory cell array unit including
   a normal memory area including a plurality of memory blocks each including a plurality of memory cells and
   a redundant memory area including a redundant block which is a replacement target of a defective block among a plurality of memory blocks;
   a storage unit that stores defective block address information indicating a position of the defective block in the normal memory area and redundant block address information indicating a position of the redundant block which is the replacement target of the defective block, both the defective block address information and the redundant block address information being in association with each other as first information; and
   an output circuit that outputs a data row having binary data exhibiting, for at least a partial area of the normal memory area, a positional relation between the defective block and a memory block other than the defective block in the normal memory area based on the first information stored in the storage unit in response to a data read signal;
   wherein the output circuit is configured to receive a specified output mode and be switchable to a first output mode or a second output mode in accordance with the specified output mode, and
   the output circuit outputs the data row in response to the data read signal when the first output mode is specified, and outputs information actually written to the memory cell array unit in response to the data read signal when the second output mode is specified.

4. A semiconductor memory device with redundant memory area comprising:
   a memory cell array unit including
   a normal memory area including a plurality of memory blocks each including a plurality of memory cells and
   a redundant memory area including a redundant block which is a replacement target of a defective block among a plurality of memory blocks;
   a storage unit that stores defective block address information indicating a position of the defective block in the normal memory area and redundant block address information indicating a position of the redundant block which is the replacement target of the defective block, both the defective block address information and the redundant block address information being in association with each other as first information; and
   a fixed-value writing circuit that, based on the first information stored in the storage unit in response to a data write start signal, writes data of one value of binary data to memory cells of the redundant block which is the replacement target of the defective block, and writes the data of another value of the binary data to memory cells of a memory block other than the defective block in the normal memory area.

5. A semiconductor memory device with redundant memory area comprising:
   a memory cell array unit including
   a normal memory area including a plurality of memory blocks each including a plurality of memory cells and
   a redundant memory area including a redundant block which is a replacement target of a defective block among a plurality of memory blocks;
   a storage unit that stores defective block address information indicating a position of the defective block in the normal memory area and redundant block address information indicating a position of the redundant block which is the replacement target of the defective block, both the defective block address information and the redundant block address information being in association with each other as first information; and
   an output circuit that receives a data read signal requesting to read data written in the normal memory area specified as a target area, and outputs a data row having binary data exhibiting data values of the target area assuming that data of one value of the binary data is written to the redundant block which is the replacement target of the defective block while data of another value of the binary data is written to a memory block other than the defective block in the normal memory area.

* * * * *